United States Patent [19]

Lu et al.

[11] Patent Number: 4,983,544
[45] Date of Patent: Jan. 8, 1991

[54] SILICIDE BRIDGE CONTACT PROCESS

[75] Inventors: Nicky C. Lu, Yorktown Heights, N.Y.; Brian J. Machesney, Burlington, Vt.; Rick L. Mohler, Williston, Vt.; Glen L. Miles, South Burlington, Vt.; Chung-Yu Ting, Katonah, N.Y.; Stephen D. Warley, Burlington, Vt.

[73] Assignee: International Business Machines Corporation, Armonk, N.Y.

[21] Appl. No.: 920,471

[22] Filed: Oct. 20, 1986

[51] Int. Cl.$^5$ .............................................. H01L 21/44
[52] U.S. Cl. ...................................... 437/200; 437/41; 437/52; 437/59; 437/919; 148/DIG. 147; 148/DIG. 19
[58] Field of Search ............ 29/591, 590, 571, 576 W; 148/DIG. 147, DIG. 20; 357/23.6, 67, 71; 427/88, 89, 90; 437/200, 192, 52, 59, 60, 919

[56] References Cited

U.S. PATENT DOCUMENTS

| | | | |
|---|---|---|---|
| 4,180,596 | 12/1979 | Crowder et al. | 427/42 |
| 4,332,839 | 6/1982 | Levinstein et al. | 427/42 |
| 4,333,099 | 6/1982 | Tanguay et al. | 357/67 |
| 4,337,476 | 6/1982 | Fraser et al. | 357/67 |
| 4,374,700 | 2/1983 | Scott et al. | 156/656 |
| 4,455,740 | 6/1984 | Iwai | 29/571 |
| 4,545,116 | 10/1985 | Lau | 29/591 |
| 4,581,623 | 4/1986 | Wang | 357/23.7 |
| 4,661,202 | 4/1987 | Ochii | 156/643 |

OTHER PUBLICATIONS

K. W. Choi et al, "CMOS Process for Titanium Salicide Bridging of a Trench and Simultaneously Allowing for True Gate Isolation," *IBM Technical Disclosure Bulletin*, Aug. 86, vol. 29, No. 3, pp. 1037–1038.
S. P. Murarka, "Refractory Silicides for Low Resistivity Gates and InterConnects," *IEDM Digest of Technical Papers* 1979, pp. 454–457.
S. Roberts, "Salicide Process for Silicide Wiring by CVD," *IBM Technical Disclosure Bulletin*, Jan. 84, vol. 26, No. 8, pp. 4338.
N. J. Jones et al, "Salicide with Buried Silicide Layer," *IBM Technical Disclosure Bulletin*, Jul. 84, vol. 27, No. 2, pp. 1044–1045.
C. Y. Ying, "Silicide for Contacts and Interconnects," *IEDM Digest of Technical Papers* 1984, pp. 110–113.
H. Okabayashi et al, "Low Resistance MOS Technology Using Self-Aligned Refractory Silicidation," *IEEE Transactions on Electronc Devices*, Sep. 1984, vol. ED-31, No. 9, pp. 1329–1334.
R. A. Haken, "Application of the Self-Aligned Titanium Silicide Process to Very Large-Scale Integrated N-Metal-Oxide-Semiconductor and Complementary Metal-Oxide-Semiconductor Technologies," *Journal of Vacuum Science & Technology B*, Nov./Dec. 1985, vol. 3, No. 6, pp. 1657–1663.
B. A. Movchan et al, "Study of the Structure and Properties of Thick Vacuum Condensates of Nickel, Titanium, Tungsten, Aluminum Oxide and Zirconium Dioxide," *Fiz. Metal Metalloued.*, 28 1969, vol. 4, pp. 83–90.
IBM Tech. Disc. Bull., vol. 29, No. 5, Oct. 1986, "High Density Vertical DRAM Cell", pp. 2335–2340.

*Primary Examiner*—Olik Chaudhuri
*Assistant Examiner*—T. N. Quach
*Attorney, Agent, or Firm*—Mark F. Chadurjian

[57] ABSTRACT

A method of forming a bridge contact between a source diffusion region of a transfer gate FET and a polysilicon-filled trench storage capacitor electrodes of the FET. A layer of titanium is evaporated at a temperature of approximately 370° C., so that the titanium has a substantially columnar grain structure and a minimum of matrix material. The bottom portions of the columnar grains have a lateral length that approximates the lateral length of the dielectric separating the source diffusion from the poly-filled trench. Thus, upon sintering at 700° C. in an N$_2$ atmosphere, titanium silicide will form over all exposed silicon regions as well as the dielectric, without shorting the FET electrodes together.

24 Claims, 2 Drawing Sheets

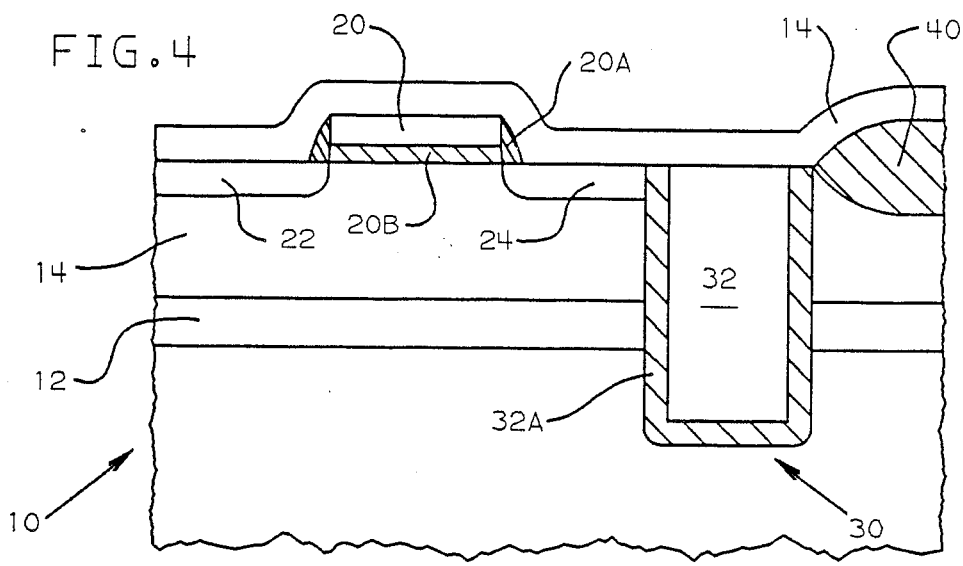
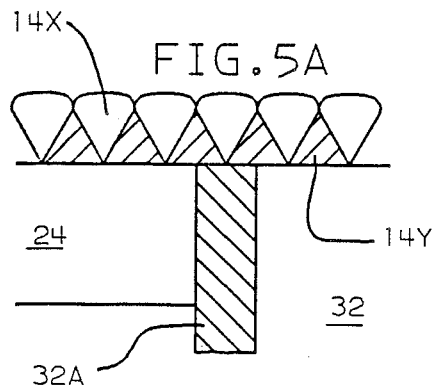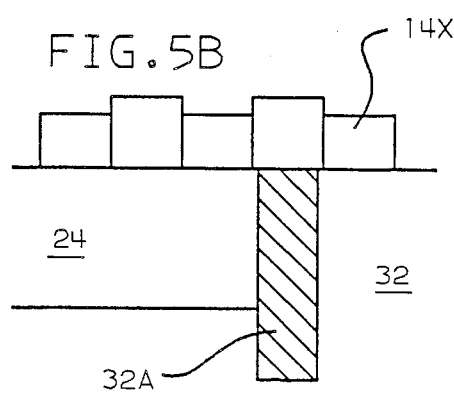
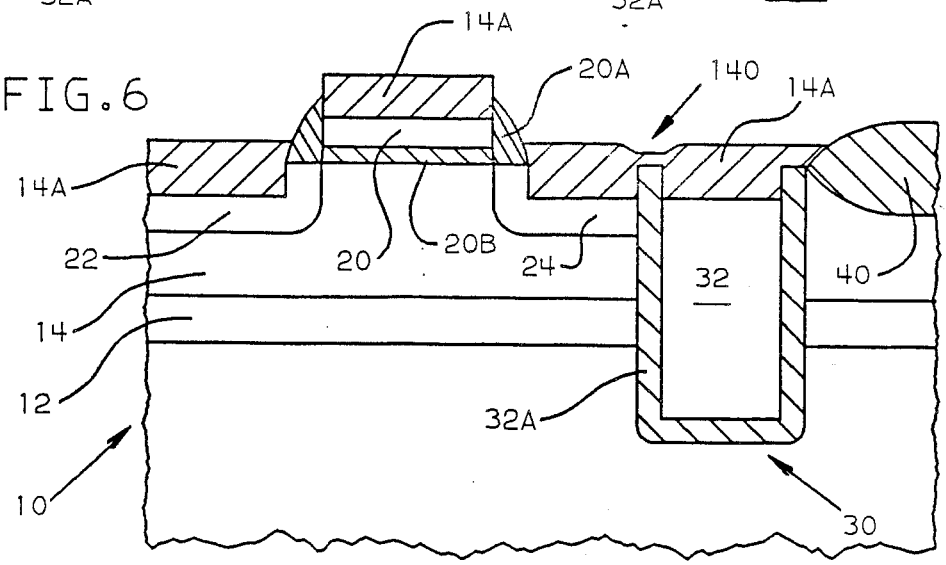

SILICIDE BRIDGE CONTACT PROCESS

TECHNICAL FIELD

The present invention relates to the general idea of utilizing a silicide reaction to form a bridge contact. More particularly, the invention relates to the use of a self-aligned silicide reaction to form a bridging contact between portions of a semiconductor surface that are separated by a thin insulating layer.

CROSS-REFERENCE TO RELATED APPLICATIONS

Reference is made to U.S. patent application Ser. No. 626,512, entitled "Dynamic RAM Cell with MOS Trench Capacitor in CMOS," filed June 29, 1984, now abandoned by Lu et al and assigned to the assignee of the present invention. This patent application relates to a one-device trench memory cell in which the source electrode of the transfer gate transistor is coupled to a polysilicon-filled trench by a layer of doped polysilicon that is masked and etched using conventional techniques.

BACKGROUND ART

The general trend in semiconductor technology toward increasing device integration has produced chips that have one million or more individual devices on them. With this increasing integration has come the challenge of interconnecting these devices so that they can form circuits that have acceptable signal propagation delays. As a greater number of devices are coupled to a given interconnection line, the cumulative resistive load that the line must drive produces corresponding increases in driving currents and signal propagation delays. In order to reduce these driving currents and delays, the industry has explored and implemented various means of decreasing the resistive load on these interconnecting lines.

One very effective way of reducing the resistive load is to form a refractory metal silicide between the interconnecting line and the device or surface to be coupled thereto. A silicide is formed by the reaction of a refractory metal (e.g. tungsten, titanium, molybdenum, nickel, tantalum, cobalt, etc.) and silicon. The resulting refractory metal silicide produces a characteristic resistance that is much lower than that achieved using conventional metals or doped polysilicon.

One particularly efficient use of refractory metal silicides is the so-called "salicide" process. In this process, the source, gate and drain electrodes of a field effect transistor are formed using conventional techniques. Then a blanket layer of refractory metal is applied, and the substrate is heated. During this heating (or "sintering") cycle, silicon will diffuse upward from areas in which the refractory metal contacts either the monocrystalline silicon substrate (e.g., the diffused source/drain regions) or the exposed polycrystalline silicon regions (e.g., the upper surface of the gate electrode) to form a silicide above these areas. At the same time, although some silicon diffuses upward from those areas in which the refractory metal overlays silicon oxide (e.g., silicon oxide isolation structures, as well as silicon oxide "spacers" that are formed on the sidewalls of the gate electrode), the diffusion rate is slow enough so that typically no silicide is formed in these regions during the sintering cycle. After the sintering cycle is completed, the structure is exposed to an etchant (typically a wet etchant) that preferentially attacks the unreacted refractory metal without appreciably attacking the reacted silicide. The term "salicide" refers to the end product of this process: regions of silicide that are aligned to and in contact with the source/drain regions (to thus lower the contact resistance) and the gate electrode (to thus lower the gate sheet resistance) of the FET, without the use of a separate mask-and-etch step to selectively provide silicide in these areas.

In an article by Murarka et al, entitled "Refractory Silicides For Low Resistivity Gates and Interconnects," *IEDM Technical Digest* 1979, Paper 20.1, pp. 454–457, the general methods of forming silicides (i.e., sputtering or evaporating the silicide from a single source, sputtering or evaporating refractory metal and silicon from separate sources, and sputtering or evaporating the refractory metal on exposed silicon) are reviewed. The article includes a graph that shows the sheet resistance of titanium silicide formed by deposition and sintering of titanium on polysilicon as being approximately one ohm/square at sintering temperatures of 700° C.–1000° C.

An article by Roberts, entitled "Salicide Process For Silicide Wiring By CVD," *IBM Technical Disclosure Bulletin*, Vol. 26, No. 8, January 1984, p. 4338, discloses a salicide process using a low-rate tungsten deposition, such that a low sintering temperature (650° C.–700° C.) may be used. This lower temperature prevents a phenomena referred to as "bridging" that will be discussed in more detail below.

An article by Jones et al, entitled "Salicide With Buried Silicide Layer," *IBM Technical Disclosure Bulletin*, Vol. 27, No. 2, July 1984, pp. 1044–1045, discloses a salicide process in which a fresh layer of silicon is formed over the gate electrode prior to further processing. This permits a salicide process to be carried out on a silicide gate electrode by adding more silicon for reaction.

An article by Ting, "Silicide For Contacts And Interconnects," *IEDM Technical Digest* 1984, Paper 5.1, pp. 110–113, describes the use of silicides for diffused contacts, for gate electrodes, and for both (i.e., salicide processing). In salicide applications, Ting notes out that the sintering temperature for TiSi$_2$ should be kept at 600°–700° C. in order to prevent bridging. Moreover, the article points out that titanium silicide should be formed in a nitrogen atmosphere, in order to further prevent bridging.

An article by Okabayashi et al, entitled "Low-Resistance MOS Technology Using Self-Aligned Refractory Silicidation," *IEEE Transactions On Electron Devices*, Vol. ED31, No. 9, September 1984 pp. 1329–1334, describes a process of silicide formation in which an inert ion beam is used after molybdenum is applied to a silicon surface in order to promote intermixing at the metal-silicon interface. This intermixing will reduce the anneal time of the subsequent silicide reaction, to thus prevent an excessive amount of lateral silicon diffusion.

An article by Haken, entitled "Application of the Self-Aligned Titanium Silicide Process to Very Large-Scale Integrated N-Metal-Oxide-Semiconductor and Complementary Metal-Oxide-Semiconductor Technologies," *Journal of Vacuum Science and Technology*, Vol. 3, No. 6, November/December 1985, pp. 1657–1663, discusses the attributes of titanium silicide in a salicide process. The paper recites the general salicide process disclosed in the Ting article, and discusses the importance of TiN in preventing silicon outdiffusion.

U.S. Pat. No. 4,180,596 (issued Dec. 25, 1979 to Crowder et al and assigned to the assignee of the invention) discloses a process of forming a silicide wherein the silicon and the refractory metal are co-evaporated from separate sources. The refractory metals discussed are tungsten, molybdenum, tantalum and rhodium.

U.S. Pat. No. 4,332,839 (issued June 1, 1982 to Levinstein et al and assigned to AT&T) discloses a process of forming titanium silicide wherein the titanium is sintered in a H$_2$ atmosphere at 900° C.

U.S. Pat. No. 4,337,476 (issued June 29, 1982 to Fraser et al and assigned to AT&T) discloses a process for forming a silicon-rich titanium silicide (i.e., TiSi$_x$, x>2) by varying the sputtering rates of the respective targets.

U.S. Pat. No. 4,545,116 (issued 10/8/1985 to Lau et al and assigned to Texas Instruments) discloses a process of forming a titanium silicide, wherein the titanium metal is sintered in a nitrogen atmosphere at a temperature of about 625° C. so as to prevent the lateral diffusion of silicon during the titanium silicide forming process.

As is apparent from the above art, it is generally known that during sintering of the refractory metal and silicon, silicon will diffuse laterally to form a silicide "bridge" in regions other than where it is desired. As shown in FIG. 1 (Prior Art), when a refractory metal 14 such as titanium is deposited on a substrate 10 having a silicon oxide layer 12 thereon, the objective is to form a titanium silicide layer 14A having a lateral length A (i.e., so that the TiSi$_2$ layer 14A is completely self-aligned with respect to the portion of substrate 10 that is exposed by silicon oxide layer 12). However, in titanium silicide reactions, silicon is the active specie. The diffusion of silicon is not directionally limited. Thus, during sintering, silicon will diffuse laterally and react with a portion of the refractory metal 14 not immediately above the exposed portion of the substrate 10. The net effect is to produce a silicide region having a lateral length of A+X.

Ordinarily, this increase in lateral length is not a debilitating problem. However, in the salicide process wherein a refractory metal is coated over a gate electrode of an FET, this problem greatly increases in importance. As shown in FIG. 2 (Prior Art), in addition to forming silicide regions 14A on either side of gate electrode 20A as well as on top of gate electrode 20, enough silicon may laterally diffuse so that silicide regions 14A' are formed on top of the silicon oxide gate electrode sidewalls 20A. These undesired "bridging" silicide regions will effectively render the FET useless by shorting together the source, gate, and drain electrodes.

As pointed out in the Ting and Haken papers and the Lau patent, this "bridging" phenomena can be avoided by the use of one or more techniques. One technique is to decrease the sintering temperature from 900° C. to approximately 600°-700° C. (i.e., the minimum temperature at which the metal and the silicon will react to form a silicide). There will be less silicon diffusion at the lower temperature. Another technique is to carry out the sintering operation in a nitrogen (N$_2$) gas atmosphere ambient. As shown in FIG. 3 (Prior Art), the nitrogen will react with the exposed surface of the titanium to form titanium nitride (TiN) 16. Since the nitrogen will diffuse more quickly into the titanium than will the silicon, the portions of the refractory metal that are susceptible to forming lateral silicide regions will be converted to TiN before the silicon can laterally diffuse to form a bridging region. Thus the silicide regions 14A will have less of a lateral portion extending above oxide layer 12. A subsequent wet etchant will remove the titanium nitride without appreciably attacking the titanium silicide. As discussed in the Ting article, the ideas of lower temperatures and a nitrogen atmosphere may be used in tandem to further reduce the lateral diffusion of silicon during the formation of a silicide region.

In dense one-device trench memory cells such as that described in the above-mentioned U.S. patent application Ser. No. 626,512, a transfer gate FET is used to access the trench storage capacitor. The doped polysilicon within the trench is separated by a layer of dielectric from the remainder of the substrate. The dielectric extends to the surface of the substrate, such that the upper surfaces of the source electrode of the FET and the poly-filled trench are separated by the dielectric. In order to couple the source electrode of the FET to the doped polysilicon within the trench, as described in the patent application a conductive material must be deposited and etched to form a contact above the source electrode and the poly-filled trench by bridging the dielectric therebetween.

The above-described process of forming the bridge contact is inefficient, in that a separate layer must be masked and etched. This adds to process expense and reduces circuit density. Thus, it would be advantageous to provide some means of connecting the source electrode to the poly-filled trench without the use of a separate mask-and-etch step.

SUMMARY OF THE INVENTION

It is thus an object of the present invention to form a contact between adjacent conductive regions on a substrate that are separated by an intervening non-conductive structure, without the use of a separate mask-and-etch step.

It is another object of the invention to provide a bridge contact between the source electrode of a transfer gate FET and a polysilicon-filled storage trench, without the use of a separate mask-and-etch step.

It is yet another object of the invention to utilize the lateral diffusion of silicon during formation of a silicide to provide a bridge contact between adjacent silicide-forming regions that are separated by a dielectric.

It is yet another object of the invention to optimize the salicide process so that bridging only occurs in desired areas.

These and other objects of the invention are realized by a salicide process in which a conductive silicide bridge is formed where desired. A refractory metal film such as titanium is evaporated on a structure in which the source electrode of the transfer gate FET is separated from a polysilicon-filled trench by a thin dielectric layer disposed on the sidewalls of the trench. The substrate temperature is held at a very high level, in order to produce a grain structure in which the bottom portions of the grains have a width approximate to the width of the dielectric layer. The structure is then sintered at a low temperature in a nitrogen ambient. Since each grain that spans the dielectric directly contacts a silicon source on either side of the dielectric, the formation of titanium nitride will be reduced and the lateral diffusion of silicon will be enhanced to the point where a self-aligned silicide bridge contact will be formed above the dielectric without shorting the source-drain regions of the transfer gate FET to the gate electrode thereof.

BRIEF DESCRIPTION OF THE DRAWING

The forgoing and other structures and teachings of the present invention will become more apparent upon a description of the best mode for carrying out the invention. In the description to follow, reference will be made to the accompanying Drawing, in which:

FIGS. 4–6 are cross-sectional views of a substrate processed in accordance with the teachings of the present invention.

DESCRIPTION OF THE BEST MODE FOR CARRYING OUT THE INVENTION

Figure 1:
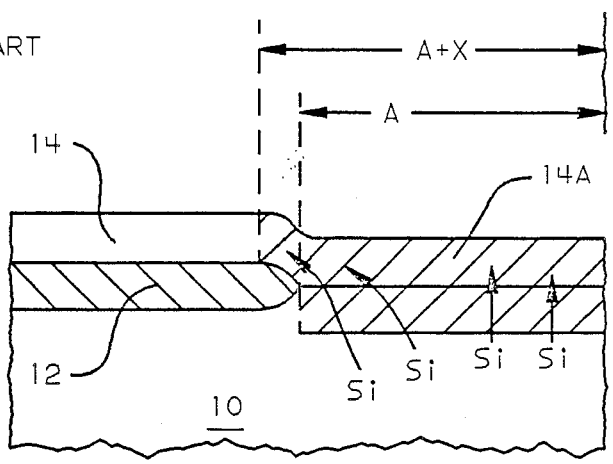
FIG. 1 (Prior Art) is a cross-sectional view of a substrate undergoing a silicide reaction, showing the lateral diffusion of silicon.
Figure 2:
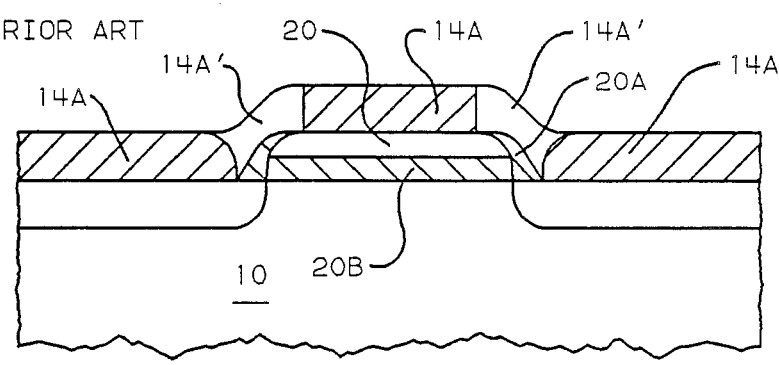
FIG. 2 (Prior Art) is a cross-sectional view of a FET undergoing a salicide reaction, showing the undesired bridging that may occur.
Figure 3:
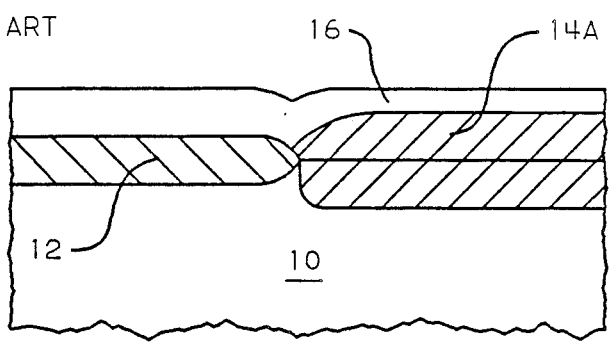
FIG. 3 (Prior Art) is a cross-sectional view of a substrate undergoing a silicide reaction, showing the formation of titanium nitride in order to retard lateral silicon diffusion.

As shown in FIG. 4, the process of the invention begins with depositing a refractory metal 14, such as titanium, on the surface of a processed semiconductor substrate 10. In accordance with the teachings of copending U.S. patent application Ser. No. 626,512 (the teachings of which are herein incorporated by reference), an n-well 13 is formed in a p-type epitaxial silicon layer 12 that is applied to a p-type, <100>oriented silicon substrate 10. A field effect transistor, having a polysilicon gate electrode 20, an p-type drain diffusion region 22, and a p-type source diffusion region 24, is formed on substrate 10. The polysilicon gate electrode 20 overlies a silicon oxide gate dielectric 20B, and the sidewalls of the gate electrode are covered by silicon oxide sidewall spacers 20A. A trench 30 is formed within the surface of the substrate. The trench is filled with a layer of p-type polysilicon 32. The polysilicon 32 is separated from the substrate 10 by a dielectric layer 32A. Dielectric layer 32A can be made of a single layer of silicon oxide, or it can be composed of a plurality of silicon oxide and silicon nitride layers. In practice, a three-layered structure of silicon oxide, silicon nitride, and silicon oxide is used as the storage node dielectric 32A. Either way, the dielectric 32A should be approximately 10–20 nm thick. The cell is separated from adjacent cells by a semi-recessed oxidation structure 40. In order for the memory cell to operate by writing voltages into and reading voltages out of the storage capacitor formed by the substrate 10, dielectric 32A and polysilicon fill 32, voltages from the source diffusion region 24 must be coupled to the polysilicon storage node electrode 32.

In considering the possibility of using the lateral silicon diffusion that occurs during the salicide process to form a conductive bridge between the source diffusion and the polysilicon trench fill, the inventors found that the bridging phenomena could not be controlled by changing the sintering conditions (i.e., time, temperature, and ambient). In general, the inventors found that bridging was either totally eliminated (such that no conductive bridge formed over dielectric 32) or was rampant across the entire wafer (such that bridging occurred over dielectric 32, sidewall spacer 20A, isolation region 40, etc.) when the sintering conditions were varied. Therefore, it was apparent that a simple solution to the problem (e.g., changing the sintering time so that bridging occurs across dielectric 32 without occurring over sidewall spacer 20A) was not available.

In exploring the nature of the deposited refractory metal, the inventors considered the grain structure of the film and the relation between grain structure, silicide formation, and the formation of titanium nitride during silicide formation. In general, the grain structure of vacuum deposited titanium is discussed in a paper by Movchan et al, entitled "Study of the Structure and Properties of Thick Vacuum Condensates of Nickel, Titanium, Tungsten, Aluminum Oxide and Zirconium Dioxide," *Fiz. Metal Metalloued*, 28, No. 4, pp. 653–660, 1969. FIG. 5A shows a view of the refractory metal as deposited at room temperature. The inverted teardrop shape of the refractory metal grains 14X results from low temperature deposition. The areas between the grains 14X are filled with an amorphous matrix material 144 (i.e., incompletely-formed grains). In general, when the refractory metal is sintered in a nitrogen atmosphere, the nitrogen penetrates along the grain boundaries to form titanium nitride. In those portions of the refractory metal that overlay silicon, silicon diffuses upward to react with the grains to form titanium silicide. In general, the formation of titanium nitride is favored over the formation of titanium silicide above the surface of dielectric 32A when the titanium has a grain structure as shown in FIG. 5A. That is, since there is a large amount of matrix material available for reaction between the grains, and since nitrogen will diffuse along the grain boundaries and will quickly react with the matrix material to form titanium nitride between the grains, titanium nitride formation is enhanced. At the same time, note that the bottom portions of the grains (i.e. the portion of each grain in contact with the substrate surface) is quite narrow. Thus, there is a good possibility that none of the grains spanning the dielectric 32A will have a bottom portion that directly overlays a source of silicon (i.e., either diffused region 24 or polysilicon 32). As such, the only source of silicon available to the grains is that silicon which laterally diffuses through reaction with grains abutting the grains over the dielectric. Since the matrix material is converted to titanium nitride relatively quickly, the titanium grains will react with the nitride to form titanium nitride, effectively preventing silicon diffusion. Simply put, when formed at room temperature, the resulting titanium grain structure promotes titanium nitride formation while limiting silicide formation in the area of the refractory metal that overlays the thin dielectric. In practice, we have found that a small amount of hydrogen in the nitrogen ambient will improve reaction control.

FIG. 5B shows the structure of the titanium layer that results from deposition at an elevated temperature. The shape of the grains 14X is now columnar, as compared to the inverted teardrop grains as in FIG. 5A. The bottom portions of the grains are much larger, such that there is a larger amount of the grain surface in contact with the substrate. As discussed in the Movchan paper and confirmed by our experiments, the columnar grain structure results when titanium is evaporated at a temperature above 370° C. Note that while in both FIG. 5A and FIG. 5B the grains have a width (or lateral length) of 20–30 nm, the grains of FIG. 5B have this width (or lateral length) in their bottom portions contacting the substrate. Thus in FIG. 5B either a single grain of titanium will span over the dielectric, or at most there will be a small amount of grain boundaries above the dielectric. In general, upon sintering in a nitrogen atmosphere, the formation of titanium silicide is now favored over the formation of titanium nitride above the surface of dielectric 32A when the titanium has a grain structure shown in FIG. 5B. For the case shown in FIG. 5B, a single grain spans the dielectric 32A to contact both diffusion region 24 and the polysilicon 32. Thus, during sintering silicon will laterally diffuse from either direction, and there is no grain boundary along which titanium nitride can penetrate to form titanium nitride. That is, while some titanium nitride will form, the lateral diffusion of silicon is greatly favored. Should more than one grain span the dielectric such that there are a small amount of grain boundaries along which nitrogen can penetrate, the relative lack of matrix material with which nitrogen can react will slow down the nitride reaction to the point where silicon has an opportunity to diffuse from either side of the dielectric to form titanium silicide. The larger titanium grain—silicon contact area means that the lateral diffusion of silicon from either side of dielectric 32 is enhanced, in that all of the grains overlaying the dielectric have a direct source of silicon (as compared to the case of the small grains shown in FIG. 5B). Simply put, when formed at high temperature, the grain structure of the titanium will promote the formation of titanium silicide while limiting titanium nitride formation in the area of the refractory metal that overlays the thin dielectric.

Therefore, when the refractory metal is formed under conditions that maximize grain contact area, a bridge contact can be formed over the dielectric 32 during a subsequent sintering cycle without shorting together the respective electrodes of the transfer gate FET. As shown in FIG. 6, silicide regions 14A are formed over gate electrode 20, drain electrode 22, source electrode 24 and the polysilicon fill 32. At the same time, a bridge contact 140 is formed over the dielectric 32A, coupling source diffusion 24 to the polysilicon fill 32. Note that there is no bridge formation between the respective electrodes of the FET device.

In constructing the conductive bridge as described above, there are several factors that must be considered in order to form a contact having an acceptable resistivity range. One factor is the poor step coverage of evaporated titanium metal. That is, if the upper surface of the polysilicon fill 32 extends above the surface of the substrate 10 by greater than 100 Å, there may be a discontinuity in the titanium as-deposited. This discontinuity will greatly increase the resistivity of the bridge contact 140. The possibility of creating this discontinuity can be diminished by incorporating several process options. One option is to etch the polysilicon within the trench so that it is relatively coplanar with the surface of the substrate. This has been achieved by polishing the excess polysilicon in the presence of a wet etchant. Other techniques, such as blanket depositing a material having an etch rate in a dry etchant that is the same as the polysilicon, and etching back the composite until an etch-stop layer is exposed, could be used here. Another option is to deposit the refractory metal from two offset sources instead of one source. This increases the step coverage of the evaporated metal. A third option is to use chemical vapor deposition (CVD) or sputtering techniques to form the refractory metal.

Another factor to be considered is the respective lateral length of the dielectric as compared to the gate electrode sidewall spacers. Although in the Figures the respective lengths of these structures do not appear to be very different, in practice the dielectric 32A is in the order of 10–20 nm in thickness (that is, its lateral length, or length in the horizontal direction that must be covered by the refractory metal, is approximately 10–20 nm), while the gate electrode 20 is approximately 300 nm in thickness (such that the sidewall spacers 20A have a lateral length of approximately 300 nm). The invention would still be operable if the lateral length of the sidewall spacers 20A was less than 300 nm. Obviously, if the lateral lengths of the two regions were substantially similar, conductive bridges would form over both the dielectric 32A and the sidewall spacers 20A, shorting together the electrodes of the transfer gate FET.

EXAMPLE 1

After the structure as shown in FIG. 4 is formed, several pre-metal deposition cleaning steps are carried out. Specifically, the substrate is etched in a buffered hydrofluoric acid (BHF) for 40 seconds, and then is rinsed in deionized water. Then, 70 nm of titanium 14 was evaporated from dual e-beam sources, with the substrate being heated to approximately 370° C. After deposition, the substrate was annealed for 20 minutes in 95% nitrogen −5% hydrogen gas at 700° C. Finally, the titanium nitride and the unreacted titanium were removed by exposure to a 5:1:1 solution of deionized water, 58% $NH_4OH$, and 30% $H_2O_2$, resulting in the structure as shown in FIG. 6. Subsequent electrical testing and SEM inspection confirmed that the bridge contact 140 was formed without any bridging of the transfer gate FET electrodes.

There are several modifications that can be made to the above-described process. Although titanium is preferred for its low resistance characteristics, other refractory metals such as nickel, cobalt, tungsten molybdenum, tantalum, etc. could be used. Whatever refractory metal is used should have a substantially columnar grain, a minimum of matrix material, and a grain contact area commensurate to the width of the dielectric 32A. While evaporation techniques were used to deposit the titanium on the wafer, it is to be understood that other techniques, such as low pressure chemical vapor deposition, plasma enhanced chemical vapor deposition, or sputtering could be used. In the Example the substrate was heated to 370° C. In practice, so long as the resulting grain structure meets the above criteria, the temperature is variable within the limits of high density semiconductor fabrication (i.e., the temperature should not exceed approximately 1200° C.). For titanium, if the deposition temperature exceeds 650° C., a polyhedral grain structure may result. The sintering temperature and gas atmosphere is variable for different refractory metals. Finally, other wet etchants (e.g., 10:1 $H_2O_2$:$H_2SO_4$) should provide sufficient selectivity to define the bridge contact.

It is to be understood that the above and other modifications to the teachings of the present invention fall within the purview of the several claims appended hereto.

We claim:

1. A method of forming a bridge contact between silicon regions on a substrate that are separated by a first insulating region having a first lateral length, without forming a bridge contact between silicon regions on the substrate that are separated by other insulating regions that have lateral lengths that are greater than that of said first insulating region, comprising the steps of:
  forming a refractory metal layer on the substrate under conditions so that said metal layer has a grain shape in which lower portions of the grains have a lateral length that approximates the lateral length of said first insulating region;
  sintering the substrate under conditions that limit lateral silicon diffusion, so that a silicide is formed over all of said silicon regions and said first insulation region without forming a silicide over said other insulating regions; and
  exposing the substrate to an etchant that preferentially removes portions of said refractory metal that did not react to form said silicide, without appreciably removing said silicide.

2. The method of forming a bridge contact as recited in claim 1, wherein said refractory metal is selected from the group consisting of titanium, tungsten, cobalt, molybdenum, nickel and tantalum.

3. The method of forming a bridge contact as recited in claim 1, wherein said refractory metal comprises titanium.

4. The method of forming a bridge contact as recited in claim 1, wherein said refractory metal is formed on the substrate by evaporation techniques.

5. The method of forming a bridge contact as recited in claim 4, wherein said refractory metal is evaporated from a plurality of offset evaporation sources.

6. The method of forming a bridge contact as recited in claim 1, wherein said refractory metal has a substantially columnar grain structure.

7. The method of forming a bridge contact as recited in claim 6, wherein said refractory metal has a minimal amount of matrix material.

8. The method of forming a bridge contact as recited in claim 3, wherein said titanium is formed on the substrate at a temperature of approximately 370° C.

9. The method of forming a bridge contact as recited in claim 1, wherein said substrate is sintered in a nitrogen ambient.

10. The method of forming a bridge contact as recited in claim 3, wherein said substrate is sintered at approximately 700° C. in a 95% nitrogen $-5\%$ hydrogen ambient.

11. The method of forming a bridge contact as recited in claim 1, wherein said etchant comprises a 10:1 mixture of hydrogen peroxide and sulfuric acid, respectively.

12. The method of forming a bridge contact as recited in claim 1, wherein said etchant comprises a 5:1:1 mixture of deionized water, 58% concentrated $NH_4OH$, and 30% concentrated $H_2O_2$, respectively.

13. A method of forming a silicide bridge contact between two relatively coplanar silicon regions on a substrate that are separated by an insulating region having a small lateral length, without forming a bridge contact between other silicon regions on the substrate that are separated by other insulating regions that have lateral lengths that are greater than the lateral length of the thin insulating layer, comprising the steps of:
  forming a layer of refractory metal on the substrate under conditions such that said refractory metal has a grain shape wherein bottom portions of the grains have a lateral length that approximates the lateral length of the thin insulating regions;
  sintering the substrate under conditions that limit the lateral formation of silicide, said refractory metal reacting with the substrate to form a silicide above said silicon regions and said thin insulating region without forming a silicide above said other insulating regions; and
  exposing the substrate to an etchant that preferentially removes remaining portions of said refractory metal without removing said silicide.

14. The method of forming a silicide bridge contact as recited in claim 13, wherein said refractory metal is selected from the group consisting of tungsten, titanium, cobalt, molybdenum, nickel and tantalum.

15. The method of forming a silicide bridge contact as recited in claim 13, wherein said refractory metal comprises titanium.

16. The method of forming a bridge contact as recited in claim 13, wherein said refractory metal has a substantially columnar grain structure and a minimal amount of matrix material.

17. The method of forming a bridge contact as recited in claim 14, wherein said refractory metal is evaporated onto the substrate from a plurality of offset evaporation sources.

18. The method of forming a bridge contact as recited in claim 15, wherein said titanium is evaporated onto the substrate while the substrate is heated to a temperature of at least 370° C.

19. The method of forming a bridge contact as recited in claim 15, wherein said substrate is sintered at 700° C. in a 95% nitrogen $-5\%$ hydrogen ambient.

20. A method of forming a silicide bridge contact between two relatively coplanar silicon regions on a substrate that are separated by a thin insulating region having a small lateral length, without forming a bridge contact between other silicon regions on the substrate that are separated by other insulating regions having lateral lengths that are greater than the lateral length of the thin insulating layer, comprising the steps of:
  forming a layer of refractory metal under conditions such that the metal has a substantially columnar grain structure and a minimal amount of matrix material;
  sintering the substrate under conditions that limit the lateral formation of silicide, said refractory metal reacting with the substrate to form a silicide above said silicon regions and said thin insulating region without forming a silicide above said other insulating regions; and
  exposing the substrate to an etchant that preferentially removes remaining portions of said refractory metal without removing said silicide.

21. The method of forming a bridge contact as recited in claim 20, wherein said grains have a lateral length that approximates that of said thin insulating region.

22. The method of forming a bridge contact as recited in claim 21, wherein said layer of refractory metal comprises titanium that is evaporated onto the substrate at approximately 370° C.

23. A method of forming a silicide bridge contact between two relatively coplanar silicon regions on a substrate that are separated by a thin insulating region having a small lateral length, without forming a bridge contact between other silicon regions on the substrate that are separated by other insulating regions having lateral lengths that are appreciably greater than the lateral length of the thin insulating layer, comprising the steps of:
  forming a layer of titanium metal on the substrate, the substrate being heated to a temperature at which the titanium has a substantially columnar grain structure with a minimal amount of matrix material, said grains having a lateral length that approximates said lateral length of said thin insulating region;

sintering the substrate at approximately 700° C. in a nitrogen atmosphere, said refractory metal reacting with the substrate to form a silicide above said silicon regions and said thin insulating region without forming a silicide above said other insulating regions; and exposing the substrate to an acid that preferentially removes remaining portions of said refractory metal without removing said silicide.

24. The method of forming a bridge contact as recited in claim 23, wherein said substrate is heated to a temperature of approximately 370° C. when said layer of titanium is formed thereon.

* * * * *